(12) United States Patent
Tebakari

(10) Patent No.: US 8,282,902 B2
(45) Date of Patent: Oct. 9, 2012

(54) APPARATUS FOR PRODUCING TRICHLOROSILANE, AND METHOD FOR PRODUCING TRICHLOROSILANE

(75) Inventor: Masayuki Tebakari, Suzuka (JP)

(73) Assignee: Mitsubishi Materials Corporation, Tokyo (JP)

( * ) Notice: Subject to any disclaimer, the term of this patent is extended or adjusted under 35 U.S.C. 154(b) by 562 days.

(21) Appl. No.: 12/472,397

(22) Filed: May 27, 2009

(65) Prior Publication Data

US 2009/0297708 A1 Dec. 3, 2009

(30) Foreign Application Priority Data

May 28, 2008 (JP) .................................. 2008-139070
May 21, 2009 (JP) .................................. 2009-122823

(51) Int. Cl.
*C01B 33/107* (2006.01)
(52) U.S. Cl. ........ 423/342; 423/341; 423/349; 422/129; 422/139; 118/725
(58) Field of Classification Search .......... 423/341–342, 423/349; 422/129, 439; 118/725
See application file for complete search history.

(56) References Cited

U.S. PATENT DOCUMENTS 8,017,099 B2 * 9/2011 Tebakari ...................... 423/348
2010/0055007 A1 3/2010 Ishii

FOREIGN PATENT DOCUMENTS

| JP | 62-123011 | | 6/1987 |
| WO | WO-2008/066027 A1 | | 6/2008 |
| WO | WO 2008/059706 | * | 5/2009 |

* cited by examiner

*Primary Examiner* — Lois Zheng
(74) *Attorney, Agent, or Firm* — Edwards Wildman Palmer LLP

(57) ABSTRACT

This apparatus for producing trichlorosilane, includes a reactor provided with gas inlets and gas outlets, a plurality of silicon seed rods held in the reactor, a heating apparatus that is provided in the reactor and heats the silicon seed rods, and a raw material gas supply system that is connected to the gas inlets and capable of selecting and supplying one of a first raw material gas for depositing polycrystalline silicon which contains trichlorosilane and hydrogen gas and a second raw material gas for producing trichlorosilane which contains silicon tetrachloride and hydrogen gas, wherein when the raw material gas supply system supplies the second raw material gas into the reactor, the silicon tetrachloride and hydrogen gas are reacted to produce a reaction product gas containing trichlorosilane.

2 Claims, 3 Drawing Sheets

APPARATUS FOR PRODUCING TRICHLOROSILANE, AND METHOD FOR PRODUCING TRICHLOROSILANE

BACKGROUND OF THE INVENTION

1. Field of the Invention

The present invention relates to an apparatus for producing trichlorosilane and a method for producing trichlorosilane which converts silicon tetrachloride into trichlorosilane.

This application claims priority on Japanese Patent Application No. 2008-139070, filed on May 28, 2008, the content of which is incorporated herein by reference.

2. Background Art

Trichlorosilane ($SiHCl_3$), which is used as a raw material for the production of highly pure silicon (Si), can be produced by conversion through a reaction of silicon tetrachloride ($SiCl_4$) with hydrogen gas.

In other words, silicon is produced by the reductive reaction and the thermolysis reaction of trichlorosilane represented by reaction schemes (1) and (2) shown below, and trichlorosilane is produced by the conversion reaction represented by reaction scheme (3) shown below.

$$SiHCl_3 + H_2 \rightarrow Si + 3HCl \quad (1)$$

$$4SiHCl_3 \rightarrow Si + 3SiCl_4 + 2H_2 \quad (2)$$

$$SiCl_4 + H_2 \rightarrow SiHCl_3 + HCl \quad (3)$$

As this apparatus for producing trichlorosilane, for example, Japanese Patent Unexamined Publication No. S62-123011 proposes an apparatus in which a plurality of heaters made of carbon are provided inside a reactor and these heaters made of carbon are directly energized and heated; thereby, heating a feed gas introduced to the reactor which contains hydrogen gas and silicon tetrachloride and converting the feed gas into trichlorosilane. In addition, a silicon compound such as silicon carbide is coated on the surface of this heater made of carbon. In other words, by protecting carbon with the coating film containing a silicon compound, the generation of impurities such as methane, methylchlorosilane, silicon carbide, and the like by the reaction of carbon with hydrogen gas, chlorosilane and hydrogen chloride in the feed gas and the reaction product gas can be prevented.

The following problems remain in the prior art described above.

That is, in the above technique disclosed in Japanese Patent Unexamined Publication No. S62-123011, silicon carbide or the like is coated on the surface of a heater made of carbon in order to prevent the generation of impurities. In this case, there were problems that the cost of the constituent members increased, and also the long-term usage of the heater could not be realized since the coating film of silicon carbide or the like was gradually etched and deteriorated.

The present invention has been made in light of these problems and an object thereof is to provide an apparatus for producing trichlorosilane and a method for producing trichlorosilane which can reduce the cost of the constituent members and which can also be configured in a way that the constituent members have a longer operating life.

SUMMARY OF THE INVENTION

An apparatus for producing trichlorosilane of the present invention includes a reactor provided with gas inlets and gas outlets, a plurality of silicon seed rods held in the reactor, a heating apparatus that is provided in the reactor and heats the silicon seed rods, and a raw material gas supply system that is connected to the gas inlets and capable of selecting and supplying one of a first raw material gas for depositing polycrystalline silicon which contains trichlorosilane and hydrogen gas and a second raw material gas for producing trichlorosilane which contains silicon tetrachloride and hydrogen gas, wherein when the raw material gas supply system supplies the second raw material gas into the reactor, the silicon tetrachloride and hydrogen gas are reacted to produce a reaction product gas containing trichlorosilane.

A method for producing trichlorosilane of the present invention includes a step of providing a plurality of silicon seed rods inside a reactor, a polycrystalline silicon depositing step of heating the silicon seed rods, and supplying a first raw material gas for depositing polycrystalline silicon which contains trichlorosilane and hydrogen gas inside the reactor so as to deposit polycrystalline silicon on the surfaces of the silicon seed rods, and a subsequent trichlorosilane producing step of switching from the first raw material gas for depositing polycrystalline silicon to a second raw material gas for producing trichlorosilane which contains silicon tetrachloride and hydrogen gas, and supplying the second raw material gas for producing trichlorosilane into the reactor so as to produce a reaction product gas containing trichlorosilane.

That is, the first raw material gas for depositing polycrystalline silicon and the second raw material gas for producing trichlorosilane are provided to be supplied into the reactor. First, the first raw material gas for depositing polycrystalline silicon is supplied into the reactor, while the silicon seed rods inside the reactor are in a heated state. Thereby, polycrystalline silicon is deposited on the surfaces of the silicon seed rods by the so called Siemens process through the reductive reaction and the thermolysis reaction represented by the aforementioned reaction schemes (1) and (2). At this time, polycrystalline silicon deposits not only on the silicon seed rods but also on the surface of each part inside the reactor, such as a supporting member for the silicon seed rod. Furthermore, a polymer compound including a silicon chloride macromolecular compound also adheres to the inner surface of the wall of the reactor of which the temperature is relatively low. As a result, the surface of each part inside the reactor is covered with the polycrystalline silicon or the polymer compound. Next, instead of the first raw material gas for depositing polycrystalline silicon, a second raw material gas for producing trichlorosilane is supplied into the reactor; thereby, trichlorosilane is produced by the conversion reaction of the reaction scheme (3). At this time, since the polycrystalline silicon deposited on the surfaces of the silicon seed rods is sufficiently heated, and the surface of each part inside the reactor is covered with polycrystalline silicon or polymer compound, highly-pure trichlorosilane can be obtained without the contamination of impurities resulting from the components of each part inside the reactor.

In the apparatus for producing trichlorosilane of the present invention, the heating apparatus may include a heater made of carbon that heats the silicon seed rods by radiation heat, and a power supply unit that applies an electric current to the silicon seed rods to generate Joule heat.

In this apparatus for producing trichlorosilane, the silicon seed rods are first heated by the heater made of carbon, and then, the power supply unit applies an electric current to the silicon seed rods; thereby, heating the silicon seed rods due to Joule heat. Thereby, the silicon seed rods can be in a state where they are heated to a high temperature. When polycrystalline silicon is deposited on the silicon seed rods, polycrystalline silicon also deposits even on the surface of the heater made of carbon. Accordingly, when trichlorosilane is produced, the surface of the heater made of carbon is covered with polycrystalline silicon, and impurities resulting from carbon are not generated, and thus trichlorosilane with high purity can be obtained.

In the apparatus for producing trichlorosilane of the present invention, the wall of the reactor may have a jacket structure including a jacket and flow passages provided inside the jacket, and a heat medium supply system may be connected to the jacket structure to supply a heat medium to the flow passages.

That is, when polycrystalline silicon is deposited on the silicon seed rods, a heat medium for cooling is supplied to the jacket to cool the inner surface of the reactor; thereby, the polymer compound can be easily condensed. On the other hand, when trichlorosilane is produced, a heat medium having a temperature of several tens of degrees Celsius or higher is supplied; thereby, silicon tetrachloride can be maintained in a gaseous state without condensing on the inner surface of the reactor, and the silicon tetrachloride can be effectively converted into trichlorosilane.

In the method for producing trichlorosilane of the present invention, the polycrystalline silicon depositing step and the trichlorosilane producing step may be alternately repeated. Thereby, trichlorosilane can be continuously produced at every predetermined time interval.

According to the present invention, when polycrystalline silicon is deposited on the silicon seed rods, polycrystalline silicon or a polymer compound also deposits on the surface of each part inside the reactor. Since trichlorosilane is produced in that state, trichlorosilane with high purity can be produced with no generation of impurities from the inner surfaces or the like of the reactor. Moreover, the production of trichlorosilane can be continued over a prolonged period of time in an environment in which the surface of each part inside the reactor is covered with polycrystalline silicon or the like. In this case, since the coating of silicon carbide (SiC) as in a conventional technique becomes unnecessary, the cost of the constituent members can be low, and the life span of the constituent members can be prolonged. Furthermore, since the same specification as that of the apparatus used for the production of polycrystalline silicon by the so-called Siemens process can be applied, easier design of the whole facility and a reduction in cost can be realized.

DESCRIPTION OF THE REFERENCE SYMBOLS

1: reactor, 2: bottom plate, 3: bell jar, 4: silicon seed rod, 5: electrode, 6: jet nozzles (gas inlets), 7: gas outlet, 8: raw material gas supply system, 9: external gas processing system, 10: power supply unit (heating apparatus), 12: connecting member, 13: seed assembly, 15: heater made of carbon (heating apparatus), 21: silicon tetrachloride supply system, 22: trichlorosilane supply system, 23: hydrogen gas supply system, 24 to 26: valve, 27: outer plate portion, 28: outer wall, 29: flow passage, 30: heat medium supply system, 31: heat-medium discharge system, 32: window, 33: infrared camera, R: silicon rod, S: adhering material.

PREFERRED EMBODIMENTS

One embodiment of an apparatus for producing trichlorosilane according to the present invention will be described below with reference to the drawings.

Figure 1:
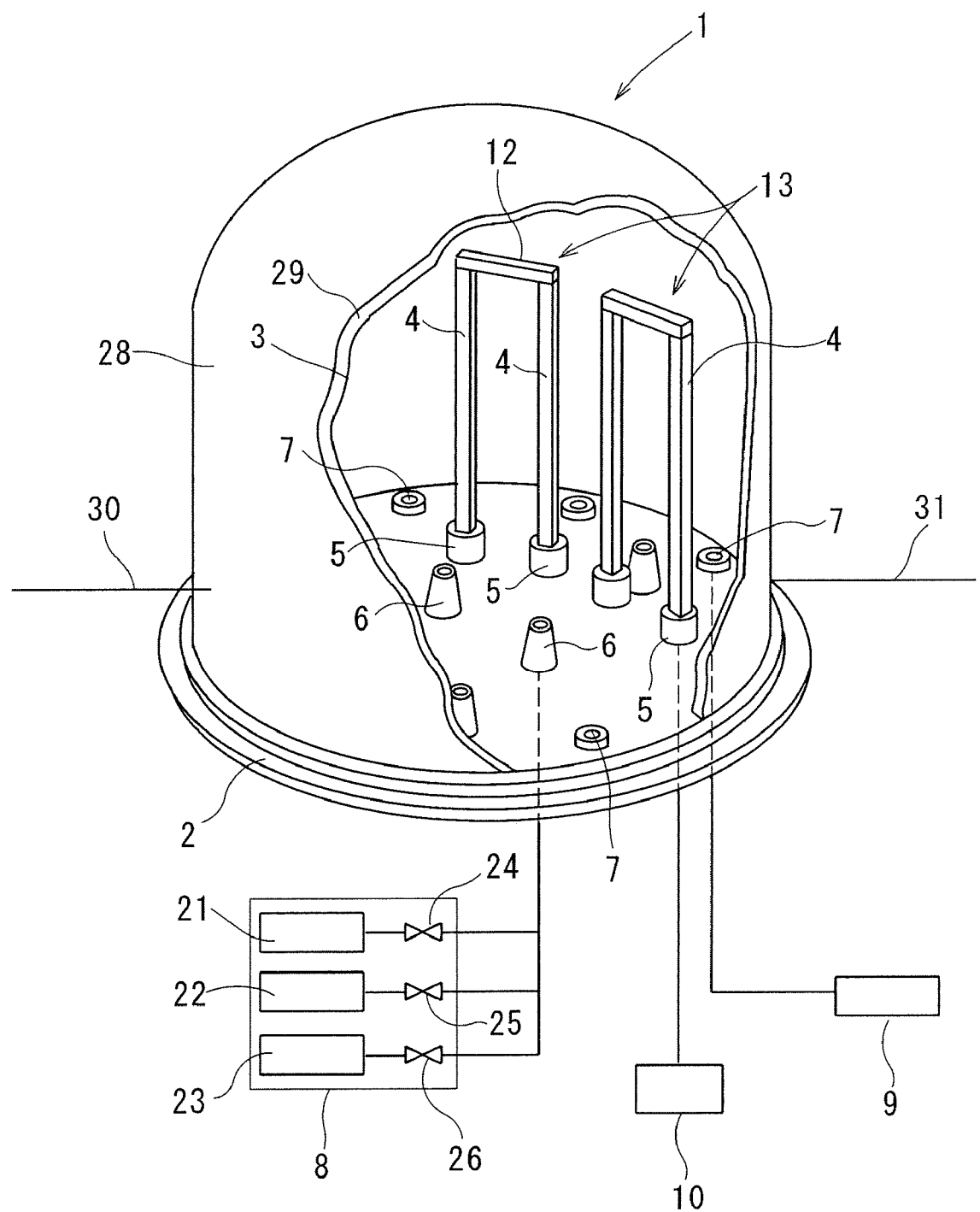
FIG. 1 is a perspective view (a partially broken-out section view) showing an embodiment of an apparatus for producing trichlorosilane according to the present invention.

FIG. 1 is a view showing the whole apparatus for producing trichlorosilane of the present embodiment. A reactor 1 of the apparatus for producing trichlorosilane includes a bottom plate 2 which constitutes a reactor bottom, and a bell jar 3 which is detachably attached to the bottom plate 2 and is formed into a bell shaped. In this case, the upper surface of the bottom plate 2 is formed into a substantially flat horizontal plane; however, the bell jar 3 is bell-shaped as a whole, and the ceiling of the bell jar is dome-shaped. Therefore, the internal space of the reactor is formed such that the central portion thereof is the highest and the outer peripheral portion thereof is the lowest. In addition, both of the bottom plate 2 and the bell jar 3 are made of, for example, stainless steel.

The bottom plate 2 is provided with a plurality of pairs of electrodes 5 to which silicon seed rods 4 made of polycrystalline silicon are attached, a plurality of jet nozzles (gas inlets) 6 for jetting a raw material gas into the reactor, and gas outlets 7 for discharging the gas after reaction to the outside the reactor.

In this case, a plurality of the jet nozzles 6 for a raw material gas are distributed at proper intervals over almost the whole upper surface of the bottom plate 2 of the reactor 1 so that the raw material gas can be uniformly supplied to each of the silicon seed rods 4. The jet nozzles 6 are connected to a raw material gas supply system 8 outside the reactor 1. A plurality of gas outlets 7 are set at proper intervals in a circumferential direction in the vicinity of an outer peripheral portion on the bottom plate 2, and are connected to an external gas processing system 9.

In addition, each electrode 5 is connected to an external power supply unit 10. Respective parts set inside the reactor 1, such as the electrodes 5, the jet nozzles 6, and the like, are made of carbon.

The silicon seed rods 4 are fixed in a state where the lower end portions thereof are inserted into the electrodes 5, and thereby, extend upward so as to stand upright. As shown in FIG. 1, one short connecting member 12 is attached to the upper ends of every two of the silicon seed rods 4 so as to connect them together as a pair. The connecting member 12 is also made of the same polycrystalline silicon as the silicon seed rods 4. A seed assembly 13 is assembled by these two silicon seed rods 4 and the connecting member 12 connecting these together so as to be substantially inverted U-shaped or H-shaped as a whole. The seed assemblies 13 are arranged substantially concentrically as a whole as the electrodes 5 are arranged concentrically from the center of the reactor 1. In addition, the silicon seed rods 4 are provided on the bottom plate 2 of the reactor 1 so as to be arranged at a density of, for example, 10 to 30 pieces/m$^2$.

A heater 15 made of carbon is provided at a central portion of the reactor 1. The heater 15 made of carbon is made of, for example, graphite, and is assembled in an inverted U-shape so as to stand upright at the electrodes 5 on the bottom plate 2, similarly to the silicon seed rods 4. The heater is also set to a height corresponding to the total length of the silicon seed rods 4 so that radiation heat can be radiated over the total length of the silicon seed rods 4.

The raw material gas supply system 8 is provided with three systems of a silicon tetrachloride supply system 21, a trichlorosilane supply system 22, and a hydrogen gas supply system 23. The three systems are provided with valves 24 to 26, respectively. By selecting one of opening and closing of these valves 24 to 26, one kind of gas or a plurality of kinds of gases can be selected and supplied.

The bottom plate 2 of the reactor 1 and the wall of the bell jar 3 have a jacket structure including a jacket and flow passages 29 provided inside the jacket. An outer plate portion 27 which covers the lower surface of the bottom plate 2 is provided as the jacket, and an outer wall 28 which covers the external surface of the bell jar 3 is provided as the jacket. And, the flow passages 29 which circulate a heat medium are formed in the inside between the bottom plate 2 and the outer plate portion 27 and the inside between the bell jar 3 and the outer wall 28, and a heat-medium supply system 30 and a heat-medium discharge system 31 are connected to the flow passages 29.

In addition, reference numeral 32 represents a window in the wall of the reactor 1, and reference numeral 33 represents an infrared camera which monitors the inside of the reactor 1 through the window 32.

Next, a method for producing trichlorosilane by using the apparatus for producing trichlorosilane configured in this way will be described.

This method for producing trichlorosilane has a polycrystalline silicon depositing step of depositing polycrystalline silicon on the surfaces of the silicon seed rods 4 inside the reactor 1, and a trichlorosilane producing step of producing trichlorosilane in a state where polycrystalline silicon has been deposited on the silicon seed rods 4. Each step will be described below.

<Polycrystalline Silicon Depositing Step>

Figure 2:
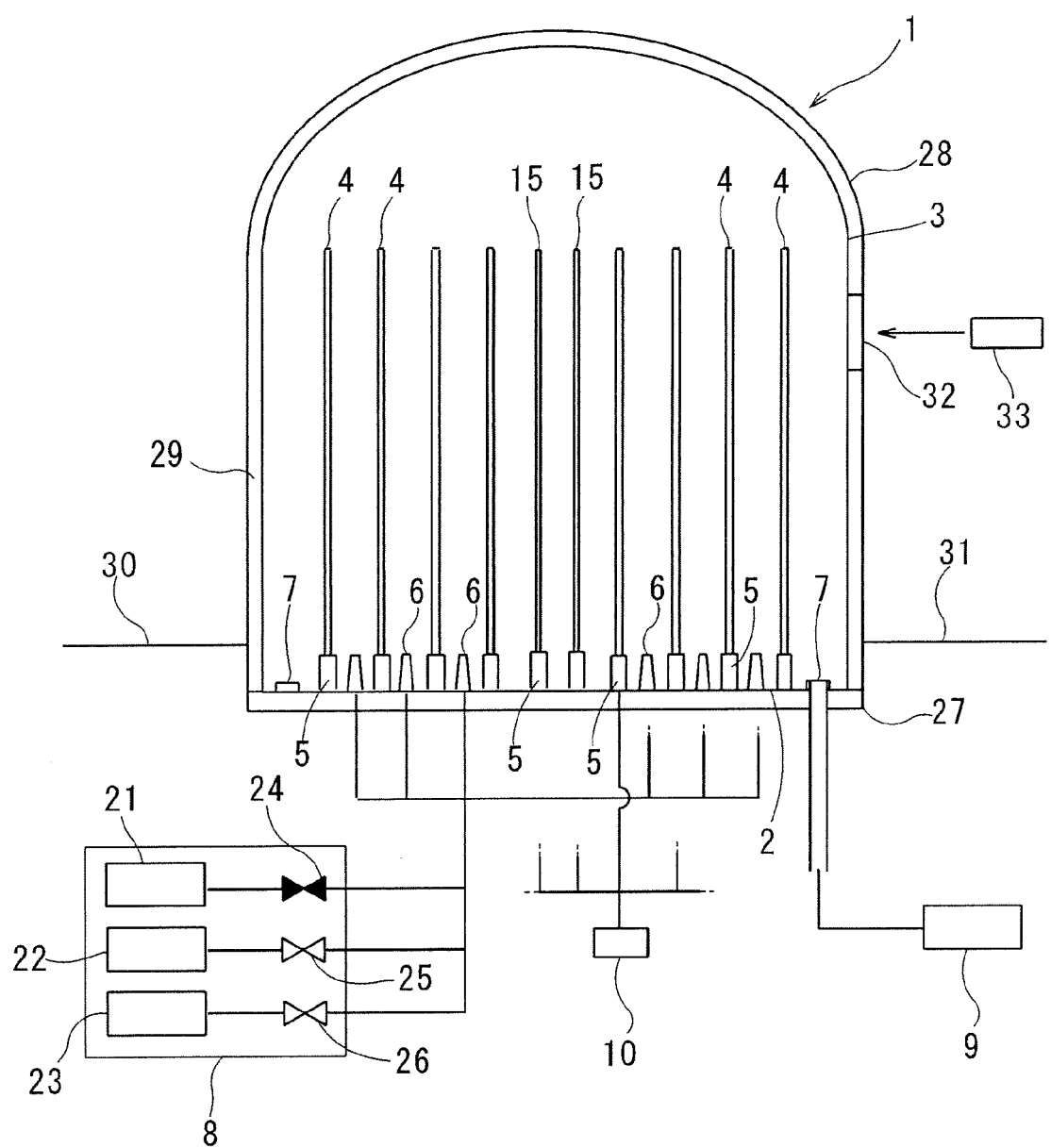
FIG. 2 is a longitudinal sectional view showing the apparatus for producing trichlorosilane of the present embodiment.

As shown in FIGS. 1 and 2, the silicon seed rods 4 are made to stand upright inside the reactor 1, and an electric current is applied to the silicon seed rods 4 and the heater 15 made of carbon which is provided at the central portion through each electrode 5 from the power supply unit 10. In this case, the heater 15 made of carbon generates heat earlier than the silicon seed rods 4, and its temperature rises, the radiation heat of the heater 15 made of carbon is transferred to the silicon seed rods 4 at positions in the vicinity thereof. Thereby, the silicon seed rods 4 are heated from their external surfaces. When the temperature of the silicon seed rod 4 rises, and then the silicon seed rod 4 becomes in a state where an electric current can be applied to the silicon seed rod 4, the silicon seed rod 4 becomes in a Joule heating state by application of an electric current from its own electrode 5. Thereafter, the heat thereof is transferred to the surrounding silicon seed rods 4; thereby, heating these silicon seed rods 4. The heat transfer phenomenon spreads one after another to the radial direction or the like of the reactor 1, and eventually, an electric current is applied to all the silicon seed rods 4 inside the reactor 1; thereby, bringing them into a heated state. That is, in this embodiment, the heating apparatus for heating the silicon seed rods 4 includes the heater 15 made of carbon, and the power supply unit 10 connected to the electrodes 5.

In the raw material gas supply system 8, first, the valve 25 of the trichlorosilane supply system 22 and the valve 26 of the hydrogen gas supply system 23 are opened, and the valve 24 of the silicon tetrachloride supply system 21 is closed (a state in which a black valve is closed and outlined valves are opened is shown in the drawing). Thereby, a mixed gas of hydrogen gas and trichlorosilane is supplied into the reactor 1 as a first raw material gas for depositing polycrystalline silicon. In this case, the molar ratio of hydrogen gas and trichlorosilane is set to, for example, 4.5 to 7.5 (hydrogen gas/trichlorosilane). When the respective silicon seed rods 4 rise to the decomposition temperature (950 to 1110° C.) of the raw material gas, polycrystalline silicon is deposited on the surfaces of the silicon seed rods 4 by the raw material gas which is jetted from the jet nozzles 6.

Furthermore, in the flow passages 29 in the wall of the reactor 1, cooling water having a temperature of, for example, 25 to 40° C. is circulated as a heat medium from the heat medium supply system 30.

Figure 3:
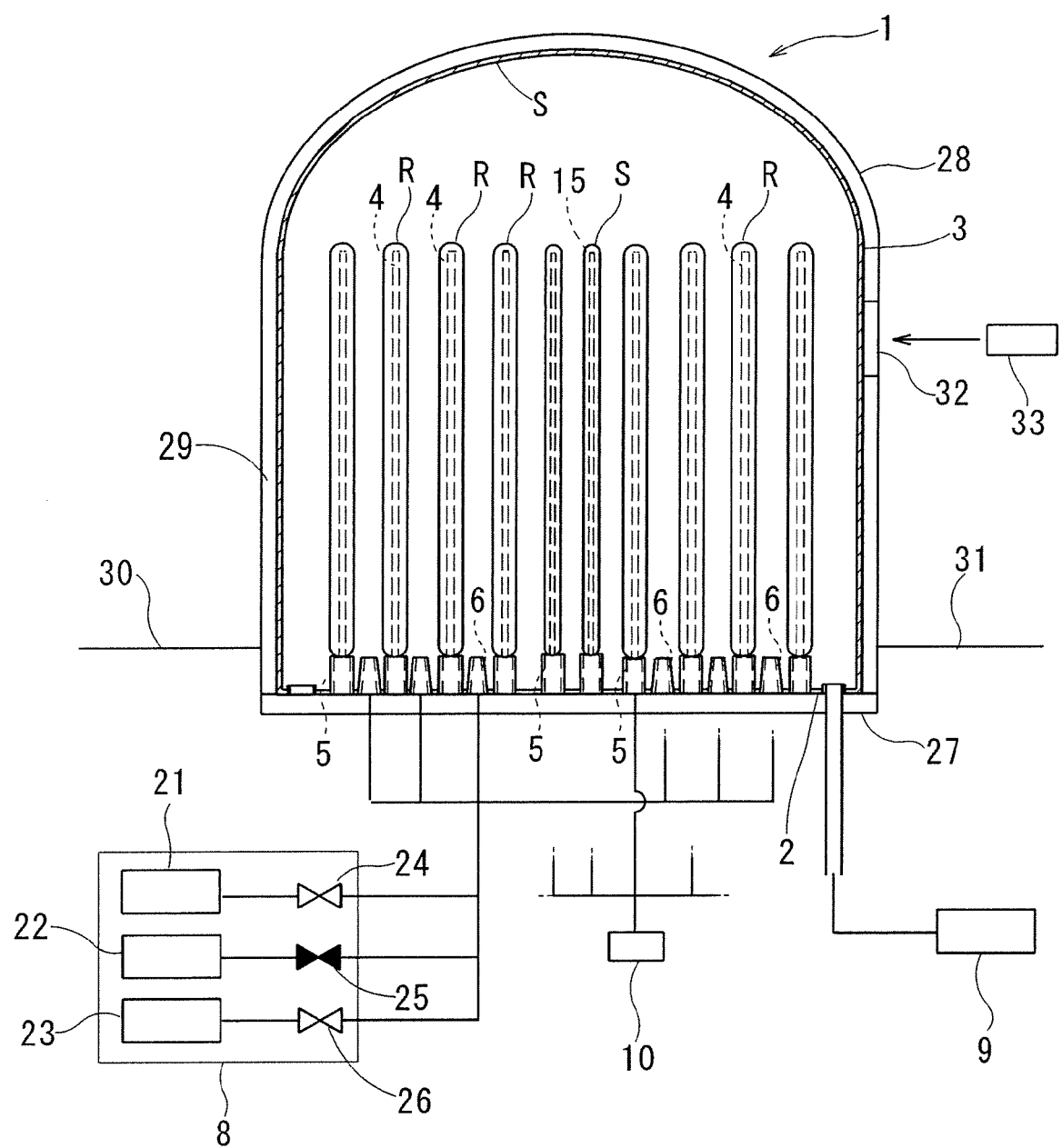
FIG. 3 is a longitudinal sectional view showing an apparatus for producing trichlorosilane in a state where trichlorosilane is produced after polycrystalline silicon is deposited on the silicon seed rods from the state shown in FIG. 2.

After holding this state for a time period of for example, 50 to 80 hours, the polycrystalline silicon which is deposited sequentially on the surfaces of the silicon seed rods 4 produces large-diameter silicon rods R as shown in FIG. 3.

Polycrystalline silicon also deposits on the electrodes 5 holding the silicon seed rods 4, the surfaces of the jet nozzles 6, and the like. Since the wall of the reactor 1 is cooled, a polymer compound including a silicon chloride polymer compound in the gas generated by the reaction condenses and adheres to the surface of the wall. The adhering material is denoted by reference numeral S in FIG. 3. In addition, silicon tetrachloride as reaction product gas, unreacted trichlorosilane, hydrogen gas, and the like are discharged from the gas outlets 7, and are sent to the external gas processing system 9.

<Trichlorosilane Producing Step>

Next, the current value from the power supply unit 10 is regulated to heat the silicon rods R to a temperature of, for example, 1050 to 1200° C. Next, the valve 25 of the trichlorosilane supply system 22 is closed, and the valve 24 of the silicon tetrachloride supply system 21 is opened. Thereby, instead of the trichlorosilane which has been supplied up to now as a raw material gas, a mixed gas of silicon tetrachloride and hydrogen gas is supplied into the reactor 1 as a second raw material gas for producing trichlorosilane. In this case, the molar ratio of hydrogen gas and silicon tetrachloride is set to, for example 1.5 to 4.5 (hydrogen gas/silicon tetrachloride). In the flow passages 29 in the wall of the reactor 1, cooling water having temperature of, for example, 60 to 85° C. which is higher than that at the time of the polycrystalline silicon is deposited is circulated as a heat medium.

The silicon tetrachloride supplied into the reactor 1 comes into contact with the silicon rods R heated to a high temperature, and is converted into a reaction product gas containing trichlorosilane by a conversion reaction. A portion of this trichlorosilane is further subjected to a thermolysis reaction and a reductive reaction, and polycrystalline silicon is deposited on the surfaces of the silicon rods R; however, most of the trichlorosilane is discharged to the outside via the gas outlets 7. Simultaneously, unreacted silicon tetrachloride, hydrogen gas, and the like are discharged, and are sent to the external gas processing system 9, whereby trichlorosilane is recovered.

In this production of trichlorosilane, the inner surface of the reactor 1, the electrodes 5, and the surfaces of the jet nozzles 6 are covered with polycrystalline silicon or the adhering material S such as a polymer compound. For this reason, there is no generation of impurities resulting from metals or carbon which constitutes these components, and highly-pure trichlorosilane can be produced.

A series of continuous processing of the above polycrystalline silicon depositing step and trichlorosilane producing step is defined as one-time unit. By alternately repeating the polycrystalline silicon depositing step and the trichlorosilane producing step while one of the raw material gases is selected, trichlorosilane can be continuously produced at every predetermined time interval.

In this method for producing trichlorosilane, at first, polycrystalline silicon is deposited inside the reactor 1, and the surfaces of the heater 15 made of carbon, the electrodes 5, and the like are coated with polycrystalline silicon, in the first half of the one-time unit, and then, a mixed gas of silicon tetrachloride is supplied to produce trichlorosilane. Therefore, even when using the components of the reactor made of metal 1, the heater 15 made of carbon, and the like, trichlorosilane can be produced under a production environment where impurities resulting from the metals or carbon of the components are not generated. Furthermore, a high temperature state can be obtained by Joule heating of the silicon rods R deposited on the silicon seed rods 4 so that the conversion reaction of trichlorosilane can be continued over a prolonged period of time, and therefore productivity is excellent.

Here, in the polycrystalline silicon depositing step, polycrystalline silicon is deposited on the surfaces of components inside the reactor 1 at portions exposed to a high temperature state caused by radiation heat by the silicon seed rods 4 and Joule heating thereof as the reaction proceeds. For this reason, the diameters of the silicon seed rods 4 increase, and the silicon seed rods 4 become the silicon rods R. Also, a polymer compound adheres to portions whose temperature is relatively low; however, the adhered polymer compound may be partially made into silicon by the radiation heat caused by the silicon seed rods 4. It is desirable that the silicon rods R have surface areas as large as possible in order to effectively function as heating sources in the next trichlorosilane producing step. However, in order to increase the surface area, it is necessary to increase the diameter of the silicon rods R, and to perform the reaction over a prolonged period of time.

When the reaction is continued over a prolonged period of time for longer than needed, distortion can easily occur inside the rods. Thus, the silicon rods R themselves will break and falling (collapsing) is likely to occur as a result. Furthermore, when the silicon rods R become thick, the interval between the silicon rods R becomes narrower compared with the initial stage of a reaction. Thus, the flow of gas inside the reactor 1 will become uneven easily, and stagnation of a gas stream becomes likely. For this reason, a uniform reaction becomes less likely. As for the diameter of the silicon rods R, in order to stably perform a reaction in the trichlorosilane producing step, for example, the diameter may be in a range from 50 mm to 140 mm, preferably be in a range from 70 mm or more to 100 mm or less. In this state, adhering material such as a polymer compound is formed on the inner surface of the reactor 1. Also, deposits of about 0.5 to 1.5 mm which have been made into silicon are formed at portions exposed to a relatively high temperature, such as the heater 15 made of carbon, the electrodes 5, and the like.

Meanwhile, in the trichlorosilane producing step, a portion of trichlorosilane deposits as polycrystalline silicon, while on the other hand, polycrystalline silicon is etched by HCl. In this manner, the depositing action and etching action of polycrystalline silicon occur in a mixed state. As for the totals of the above actions, the rate of the etching action is larger (for example, in the case of silicon rods whose diameter is about 100 mm, the diameter thereof decreases by 0.02 mm per hour). Accordingly, the amount of polycrystalline silicon and the like on the surfaces of the silicon seed rods 4 and components inside the reactor decreases gradually. A switch to the polycrystalline silicon depositing step is made again before the coatings on the components disappear.

For example, in a reactor 1 having an internal volume of 14 $m^3$ in which about 100 silicon seed rods 4 of an area of 1 cm square and a length of about 2 m are provided, it is necessary to supply a raw material gas having a molar ratio (hydrogen gas/trichlorosilane) of 4.5 to 7.5 for 50 hours in order to obtain silicon rods R with a diameter of 50 mm or more in the polycrystalline silicon depositing step. For example, a raw material gas obtained by mixing trichlorosilane at a flow rate of 300 moles/min with hydrogen gas at a flow rate of 2100 moles/min is supplied for 50 hours. When a switch to the next trichlorosilane producing step is made in that state, a raw material gas having a molar ratio (hydrogen gas/silicon tetrachloride) of 1.5 to 4.5 is continued to supply for 25 hours. For example, a raw material gas obtained by mixing silicon tetrachloride at a flow rate of 200 moles/min with hydrogen gas at a flow rate of 600 moles/min is supplied for 25 hours. Thereby, trichlorosilane of about 52000 moles can be obtained.

It should be understood that the present invention is not limited to the above embodiment, but various modifications can be made without departing from the spirit and scope of the present invention.

For example, in the above embodiment, the heater 15 made of carbon is used for the first heating of the silicon seed rods 4. However, other heating apparatus such as high-frequency induction heating apparatus, and the like can also be applied.

Although each of the silicon seed rods 4 is arranged so as to stand upright on the bottom of the reactor 1, a configuration in which each silicon seed rod 4 is suspended and supported from a ceiling portion of the reactor 1 may be adopted, or each silicon seed rod 4 may not necessarily be arranged in a vertical posture, but may be arranged in a horizontal posture.

A heat exchange mechanism for heat exchange between gasses, that is, the introduced supply gas and the discharged reaction product gas, may be provided. In this case, it is possible to further save power.

What is claimed is:

1. A method for producing trichlorosilane comprising:
    a step of providing a plurality of silicon seed rods inside a reactor;
    a polycrystalline silicon depositing step of heating the silicon seed rods, and supplying a first raw material gas for depositing polycrystalline silicon which contains trichlorosilane and hydrogen gas inside the reactor so as to deposit polycrystalline silicon on surfaces of the silicon seed rods and surfaces of parts inside the reactor; and
    a subsequent trichlorosilane producing step of switching from the first raw material gas for depositing polycrystalline silicon to a second raw material gas for producing trichlorosilane which contains silicon tetrachloride and hydrogen gas, and supplying the second raw material gas for producing trichlorosilane into the reactor in a state where the surfaces of the silicon seed rods and the surfaces of the parts inside the reactor are coated with deposited polycrystalline silicon so as to produce a reaction product gas containing trichlorosilane.

2. A method for producing trichlorosilane according to claim 1,
    wherein the polycrystalline silicon depositing step and the trichlorosilane producing step are alternately repeated.

* * * * *